United States Patent [19]

Cox et al.

[11] 4,218,775
[45] Aug. 19, 1980

[54] PUSHBUTTON RADIO TUNER WITH ILLUMINATED PUSHBUTTON DISPLAY

[75] Inventors: Richard S. Cox, Hoffman Estates; Paul D. McGee, Medinah, both of Ill.

[73] Assignee: Motorola, Inc., Schaumburg, Ill.

[21] Appl. No.: 918,115

[22] Filed: Jun. 22, 1978

[51] Int. Cl.² .......................... H04B 1/20; H03J 1/04
[52] U.S. Cl. .................................. 455/344; 116/263; 200/DIG. 47; 334/7; 334/86; 360/137; 455/155
[58] Field of Search ........................ 334/7, 15, 86, 87; 116/124 L, DIG. 5, DIG. 28, 124.1 R, 241, 263, 202, 279; 325/311, 312, 455; 200/DIG. 47; 360/137; 179/100.11

[56] References Cited

U.S. PATENT DOCUMENTS

| | | | |
|---|---|---|---|
| 3,169,506 | 2/1965 | Morris | 116/124.4 |
| 3,536,859 | 10/1970 | Tolar | 179/100.11 |
| 3,613,007 | 10/1971 | Endres | 334/86 |
| 3,619,591 | 11/1971 | Korski | 200/DIG. 47 |
| 3,780,248 | 12/1973 | Martin | 200/DIG. 47 |
| 3,792,387 | 2/1974 | Arrington et al. | 334/7 |
| 4,090,134 | 5/1978 | Arai | 179/100.11 |

Primary Examiner—Paul L. Gensler
Attorney, Agent, or Firm—James W. Gillman; Melvin A. Klein; Phillip H. Melamed

[57] ABSTRACT

A pushbutton tuner display apparatus for an entertainment device is disclosed in which a plurality of pushbuttons are used to tune a radio apparatus in the entertainment device in one mode of operation, while in another mode of operation the entertainment device operates as a cartridge tape player in which the pushbuttons are utilized as display devices which indicate which tape track is being monitored by the cartridge tape player. Additionally, one pushbutton is utilized as a display to indicate the reception of a stereo radio signal. Each pushbutton comprises a clear plastic light pipe surrounded by an opaque plastic part having openings at the front and rear. An associated light bulb mounted inside the frame of the entertainment device is utilized to provide light to each rear portion of each light pipe, and each light pipe has a prismatic portion which transmits received light to a front portion of the light pipe where an illuminated operative state display indication is produced.

24 Claims, 3 Drawing Figures

PUSHBUTTON RADIO TUNER WITH ILLUMINATED PUSHBUTTON DISPLAY

BACKGROUND OF THE INVENTION

The present invention generally relates to the field of display apparatus used in conjunction with manually actuatable pushbuttons that select different operative modes of operation.

The use of pushbuttons to select different operative modes of operation is well known. Such pushbuttons are commonly used in automotive radios to select the predetermined operative frequencies at which the radio apparatus will function. In such automotive radios, generally only a limited amount of visual surface area can be provided thus resulting in limiting the number of operative modes of the radio which can be visually displayed to the radio operator. The fact that only a limited amount of area is available for visual displays becomes a critical consideration when automotive radios are combined with other entertainment devices, such as cassette or cartridge tape players or CB radios. In such combination units, because of the greater number of operative states of the combination unit, a greater number of visual indications of these operative states must be provided. Because only a limited amount of visual surface area is available, this results in either making each one of these visual displays smaller so as to accommodate the space limitations, which is aesthetically undesirable, or eliminating some of the displays, which is also undesirable.

SUMMARY OF THE INVENTION

An object of the present invention is to provide a pushbutton tuner display apparatus which permits visually displaying a number of different operative states while utilizing a minimum amount of space.

In one embodiment of the present invention a display apparatus for a pushbutton operative device is provided. The pushbutton display apparatus comprises a device; a plurality of manually actuatable pushbuttons mounted to said device, each of said pushbuttons capable of selecting a different operative mode for the device; and visual display means carried on each of said pushbuttons, each of said visual display means selectively operable to display the selection of an operative state of said device, wherein said operative modes selected by manual actuation of said pushbuttons are different from said displayed operative states.

More particularly, an entertainment device is provided which comprises a combination pushbutton tunable radio and cartridge tape player. The pushbuttons are utilized to tune the radio when the entertainment device is operating as a radio and the pushbuttons carry visual display means to indicate which cartridge tape track is monitored by the entertainment device when the device is operated as a cartridge tape player. By utilizing the radio tuning pushbuttons to carry visual displays indicating operative states unrelated to the operative modes selected by the radio pushbuttons, valuable display space on the front panel of the entertainment device is conserved. This enables the use of larger visual displays and results in an esthetically appealing, non-cluttered appearance for the front panel of the entertainment device.

Preferably, the visual display means carried by the pushbuttons comprise a light pipe which conducts light therethrough wherein the light pipe is illuminated by light sources contained within the frame of the entertainment device. This results in producing an illuminated visual display at the front end of the pushbutton, while opaque portions of the pushbutton shield the light pipe from undesired light on the top and sidewalls of the light pipe.

BRIEF DESCRIPTION OF THE DRAWINGS

For a more complete understanding of the invention, reference should be made to the drawings in which.

DESCRIPTION OF THE PREFERRED EMBODIMENTS OF THE INVENTION

Figure 1:
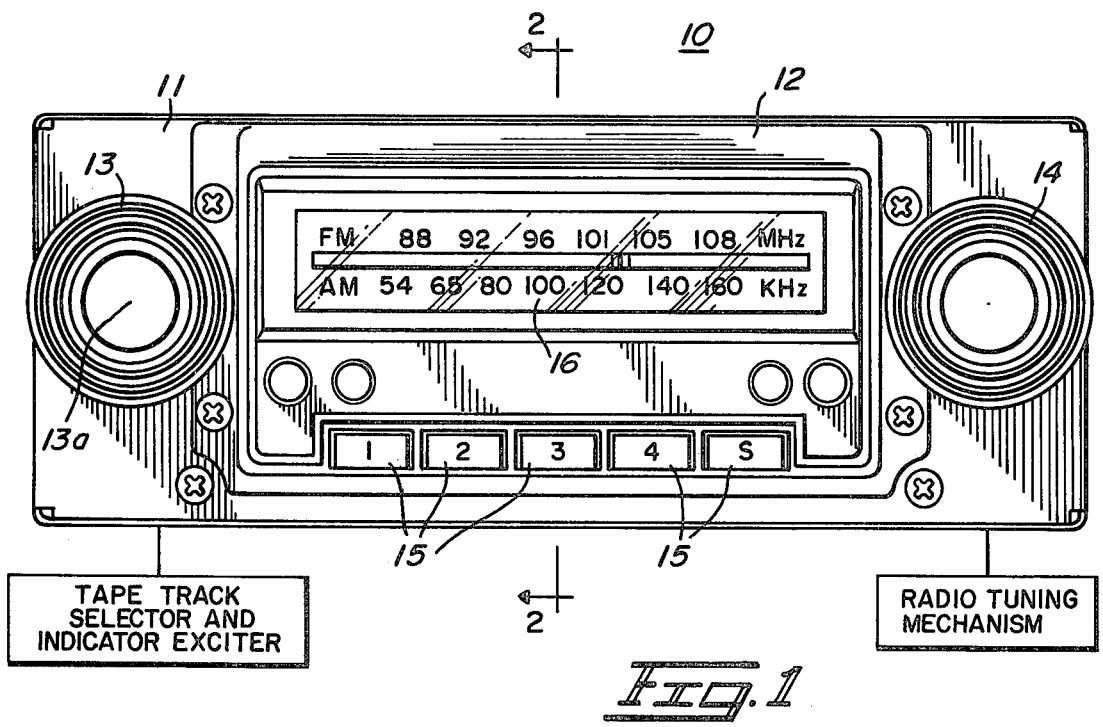
FIG. 1 is a planar view of the front of a pushbutton entertainment device utilizing the present invention.

Referring to FIG. 1, an automotive entertainment device 10 is illustrated wherein the device comprises a combination pushbutton AM/FM radio and cartridge tape player. The device 10 has a metal frame 11 which serves as a chassis and housing for radio and cartridge tape player components. A front control and display panel 12 is mounted to the frame 11 along with adjustable rotary knobs 13 and 14. By rotating the knob 13 about its axis 13a, an adjustment of the volume of the entertainment device 10 is implemented and by rotating the knob 14 a manual adjustment of the tuning of the radio apparatus of the device 10 is implemented.

The rotary knob 13 is also axially movable and by such axial movement functions as a pushbutton assembly which controls the stepping of a ratchet and pawl assembly that adjusts the height position of a magnetic head inside the device 10 which thereby selectively monitors different tape tracks on a tape cartridge inserted into the device 10. Preferably the rotary knob 13 is biased axially toward an outward position and each inward momentary manual movement of the knob 13 will result in sequentially stepping the cartridge magnetic head through each of four different vertical positions in which the head can monitor four different tape tracks on an inserted cartridge tape.

A plurality of manually actuatable pushbuttons 15 are mounted to the device 10 wherein each of these pushbuttons is operable to select a different operative frequency for the radio apparatus contained in the device when the entertainment device is operating as a radio receiver. Preferably, a portion of each pushbutton 15 is coupled to a conventional key slide mechanism for setting and recalling different predetermined radio frequencies. The operation of such pushbutton tuning apparatus is well known to those skilled in the art.

Figure 2:
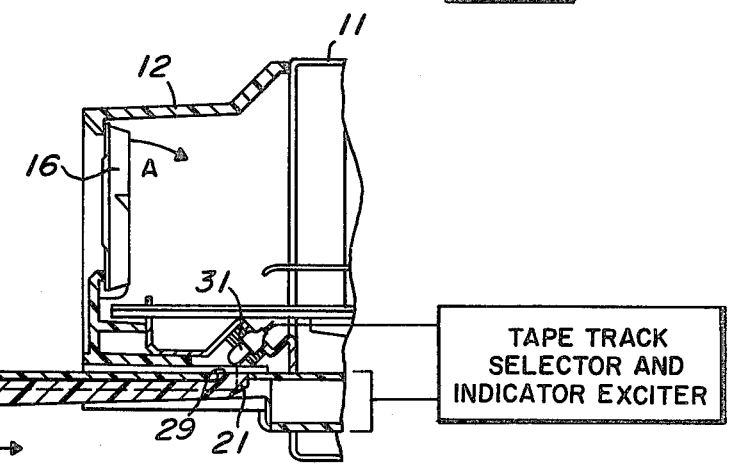
FIG. 2 is a cross-sectonal view of the device shown in FIG. 1 taken along the line 2—2.
Figure 3:
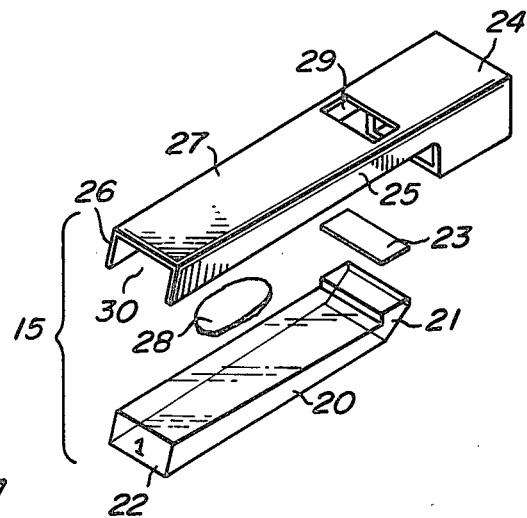
FIG. 3 is a perspective assembly view of one of the pushbuttons illustrated in FIG. 1.

An AM/FM tuning scale dial display 16 is pivotally mounted to the plate 12 and is normally spring biased in the position shown in FIGS. 1 and 2. The radio tuning display 16 not only functions to provide an indication of the frequency to which the radio apparatus in the entertainment device 10 is tuned, but the dial display 16 also forms a pivotal doorway through which a tape cartridge carrier can be inserted into the device 10 in order to initiate operation of the device as a cartridge tape player. Thus it is contemplated that upon insertion of a cartridge tape carrier, the display 16 will pivot downward in the direction A (FIG. 2) to permit the insertion of a cartridge carrier into the device 10. Such dial-indoor assemblies are well known to those of skill in the art.

Each of the pushbuttons 15 carries a visual display means comprising an illuminated light carrier pipe 20 preferably comprising an at least translucent, in clarity, molded plastic body which has a substantially solid rectangular shape and a prismatic area 21 at a rear portion of the light carrier 20. The carrier 20 has a front portion comprising a front surface 22 having an indicative pattern formed thereon by forming alternate clear and opaque portions on the surface 22. A very thin translucent colored film 23 is applied to the prismatic portion 21 of the light carrier 20 and functions to color light which is transmitted longitudinally by the light carrier 20 in a manner to be described.

Each pushbutton 15 also comprises a substantially opaque housing 24 having a partial hollow rectangular shape comprising two sidewalls 25 and 26 and a top wall 27 connected in between. The light carrier 20 can be mounted inside of the housing 24 by a thin layer of adhesive 28 which mounts the components 24 and 20 together such that only a minimal area of an external surface of the light carrier 20 is directly coupled to the surrounding opaque housing 24 while the remaining external surfaces of the light carrier 20 are at least slightly spaced apart from the surrounding opaque housing. This construction prevents the opaque housing from absorbing any substantial amount of light being transmitted through the light carrier 20. By providing a slight separation between the light carrier 20 and the opaque housing 24, the light transmitting characteristics of the light carrier 20 were found to be substantially improved.

If some loss of light transmitted through the light carrier 20 can be tolerated, then the opaque housing 24 can be injection molded and subsequently the light carrier 20 can be injection molded into the housing forming an integral assembly. This creates a less expensive pushbutton assembly without an excessive loss of transmitted light.

An opening 29 is provided in the opaque housing 24 adjacent to the prismatic area 21 at the rear of the light carrier 20. In addition, an opening 30 is provided at a front portion of the opaque housing 24 through which the front surface 22 of the light carrier 20 can be viewed.

Essentially the elements 20-30 comprise each of the pushbuttons 15, and these pushbuttons, as previously mentioned, are operative to select different radio frequencies for radio apparatus contained in the entertainment device 10 in a manner which is well known.

The pushbuttons 15 also perform a display function which is the essence of the present invention. This is accomplished by selectively exciting a light emitting means which generates light that passes through the opening 29, through the colored thin film 23 and into the rear prismatic portion 21 of the light carrier 20. The prismatic portion 21 thereupon alters the direction of the light received and transmits this light longitudinally through the body of the carrier 20 and out the front surface 22 of the carrier. This described transmission of light is illustrated by the dashed arrow B shown in FIG. 2. It should be noted that each of the pushbuttons 15 is longitudinally movable in directions toward and away from the frame 11 as indicated by the double arrow C illustrated in FIG. 2.

Preferably, the opaque housing 24 shields the light carrier 20 from normal ambient light and therefore causes the illumination of the front surface 22 only when selectively produced light is passed through the opening 29. Thus the opaque housing prevents external light from reaching the side and top surfaces of light carrier 20. Since the device 10 is intended for installation in an automobile, only a minimal amount of light would be able to reach the light carrier 20 from below the entertainment device 10, and therefore no opaque shielding was found to be necessary for the bottom surface of the carrier 20.

Preferably, the front surface 22 of the light carrier is oriented at an oblique angle to the directions of movement C of the pushbutton 15, and the surface 22 is oriented facing upward when viewed from the front of the entertainment device 20. Again this orientation has been found to be desirable since the entertainment device 10 is intended for installation in the dashboard of an automobile and therefore would generally be below the field of vision of the operator of the entertainment device. Thus by providing an upward facing display surface, the displays produced by the light carriers 20 will be more readable.

In order to provide the light for selectively exciting the light carriers 20, a plurality of associated light emitting sources, preferably light bulbs 31, are provided mounted to the frame 11 and operatively located adjacent to the openings 29 and the prismatic portions 21 of the pushbuttons 15. Whenever the light carrier of any one of the pushbuttons 15 is desired to be excited, the associated light emitting source located adjacent to that light carrier's prismatic portion 21 is excited. This will result in selectively exciting any desired one of the light carriers 20 carried by the pushbuttons 15.

According to the present invention, each of the manually actuable pushbuttons 15 can select a different operative frequency for the radio apparatus contained in the entertainment device 10. However, the visual display means, comprising the light carriers 20, carried by each of the pushbuttons are intended to display operative states of the entertainment device 10 which are different from the operative modes (operative frequencies) that are selected by manual actuation of the pushbuttons 15. For example, four of the pushbuttons 15 illustrated in FIG. 1 have the digits 1 through 4 displayed on the front surfaces 22 of the light carriers 20 carried by them. Each of these digits represents one of the four tape track positions which the magnetic tape head in the entertainment device 10 can be set at. Thus when the entertainment device 10 is operative as a cartridge tape player, one of the four digits 1 through 4 will be excited by selectively exciting one of the light bulbs 31 that is located adjacent to the display which indicates the tape track being monitored by the magnetic tape head. Another one of the radio tuning pushbuttons 15 has the letter S inscribed on the front surface 22 of the light carrier 20 carried thereby. It is intended that this light carrier will be selectively excited in response to the detection of a received stereo radio signal by the radio apparatus contained in the device 10.

Basically, the present invention provides for having manually actuatable pushbuttons which select different operative modes of operation for an entertainment device, and having each of these manually actuatable pushbuttons carry a visual display which indicates a different operative state than those which are selected by manual actuation of the pushbuttons. In this manner, the space taken up by the presence of manually actuatable pushbuttons is utilized to display operative information concerning the device wherein this operative information is not directly related to the modes of operation that are selected by actuation of the pushbuttons. This dual use of the space required for the tuning pushbuttons enables the use of larger displays and results in an esthetically pleasing non-congested presentation of the operative information which is to be displayed to the operator of the entertainment device.

It should be noted that in the foregoing explanation of the present invention, the terms "front", "rear", "up" and "down" refer to the normal orientation of the entertainment device 10 in which the displays and controls are provided on a front surface of a device 10 and the device is mounted in a normal operative position as shown in FIG. 1.

While in the preferred embodiment of the present invention it is contemplated that the axial movement of the rotary knob 13 will result in controlling a ratchet and pawl mechanism to selectively step the magnetic head of the cartridge tape player apparatus such that it monitors different tape tracks, thereby causing the selective excitation of different ones of the pushbuttons 15 so as to indicate the tape track being monitored, it should also be noted that the present invention also contemplates the dual use of the pushbuttons 15 so as to provide a similar tape track selecting control as that provided by the knob 13. In other words, the present invention also contemplates utilizing the pushbuttons 15, when the entertainment device 10 is in a tape player mode of operation, to manually select which one of the tape tracks will be monitored and also to display the selected tape track. This can readily be accomplished by various well known mechanisms since cartridge tape players which select a specific tape track in response to actuation of a specific pushbuttons are well known. However, the present invention still contemplates providing pushbuttons which function to select one set of operative modes while visual displays carried by these pushbuttons provide visual indications of a different set of operative conditions.

While we have shown and described specific embodiments of this invention, further modifications and improvements will occur to those skilled in the art. All such modifications which retain the basic underlying principles disclosed and claimed herein are within the scope of this invention.

We claim:

1. A display apparatus for a pushbutton operative device, comprising:
   an audio entertainment system device capable of two different types of audio operation
   a plurality of manually actuatable pushbuttons mounted to said device, each pushbutton capable of selecting a different operative mode for the device in one type of operation; and
   visual display means carried on each of said pushbuttons, each of said visual display means selectively operable to display the selection of an operative state of said device in the second type of operation, wherein said operative modes selected by manual actuation of said pushbuttons are different from said displayed operative states, and wherein said displayed operative states are unrelated to both the operative modes selected by manual actuation of said pushbuttons and which of said pushbuttons have been manually actuated to select one of said operative modes.

2. A display apparatus according to claim 1 wherein each of said visual display means comprises a selectively illuminated display carried on each of said pushbuttons.

3. A display apparatus according to claim 2 which includes excitation means mounted in said device for selectively exciting said pushbutton carried visual display means to render said visual display means operative to indicate said operative states.

4. A display apparatus according to claim 3 wherein each of said illuminated displays is oriented on a corresponding pushbutton carrier to provide a display on at least one of a front and top face of said manually actuatable pushbutton.

5. A display apparatus according to claim 4 wherein each of said pushbuttons is manually actuatable by inward manual movement of the pushbutton into the device.

6. A display apparatus according to claim 5 wherein the device comprises radio apparatus and wherein said pushbuttons tune said radio apparatus by selecting predetermined operative radio frequencies for said radio apparatus.

7. A display apparatus according to claim 6 wherein said device comprises cartridge tape player apparatus and wherein said excitation means excites at least one of said illuminated displays to indicate which tape track of a tape cartridge is being monitored by said tape player apparatus.

8. A display apparatus according to claims 6 or 7 wherein one of said pushbutton carried illuminated displays indicates the reception of a received stereo radio signal and wherein said excitation means detects said stereo radio signal and excites said one illuminated stereo display in response thereto.

9. A display apparatus according to claim 7 wherein said tape player apparatus includes a manually actuatable means for selecting which tape track is to be monitored.

10. A apparatus according to claim 9 wherein said manually actuatable tape track selecting means is in addition to said pushbuttons which tune the radio apparatus of said device.

11. A display apparatus according to claim 10 wherein said tape track selecting means comprises a pushbutton manually actuatable device mounted on a control shaft whose rotary position determines at least one operative condition of said radio apparatus.

12. A display apparatus according to claim 3 wherein said pushbuttons are also manually actuatable to select said operative states for said device which are displayed by said illuminated displays carried by said pushbuttons.

13. A display apparatus according to claims 3 or 12 wherein each of said illuminated displays comprises an at least translucent light carrier means for carrying light therethrough.

14. A display apparatus according to claim 13 wherein each of said pushbuttons comprise a substantially opaque means substantially surrounding at least a top and two side surfaces of said light carrier means, openings being provided in said opaque means at a rear portion of said light carrier means located inside of a frame of said device and at a front portion of said light carrier means located outside of the frame of said device.

15. A display apparatus according to claim 14 wherein said light carrier means and said opaque means are mounted together with only a minimal area of external surface of said light carrier means being directly coupled to said surrounding opaque means and the rest of said external surface of said light carrier means being spaced from said surrounding opaque means.

16. A display apparatus according to claim 14 wherein each of said light carrier means is substantially a solid rectangle in shape having a prismatic area at said rear portion for altering the direction of light carried through said light carrier means.

17. A display apparatus according to claim 16 wherein said excitation means comprises a plurality of selective light emitting means, each of said light emitting means fixed to said device frame and operatively located adjacent to an associated rear prismatic portion of said light carrier means.

18. A display apparatus according to claim 17 wherein said pushbuttons are longitudinally movable in directions toward and away from the frame of said device.

19. A display apparatus according to claim 18 wherein said opaque means have a partial hollow rectangular shape comprising at least two sidewalls and a top wall connected inbetween, said opaque means preventing external light from reaching the side and top surfaces of said light carrier means connected to said opaque means.

20. A display apparatus according to claim 19 wherein said front portion of said light carrier means has a front surface which is oblique to the direction of movement of said pushbutton and is oriented facing upward when viewed from the front of said device, an indicative pattern formed by clear and opaque portions being formed on said front surface.

21. A display apparatus according to claim 20 wherein said light carrier means is formed from molded clear plastic and said opaque means is also a molded plastic part.

22. A display apparatus according to claim 21 wherein said light carrier means and said opaque means are bonded together by an adhesive applied in selected areas between said light carrier means and said opaque means.

23. A display apparatus according to claim 21 wherein a colored film of material is applied to the rear portion of said light carrier means such that light carried through the light carrier means will have a predetermined hue.

24. A display apparatus according to claim 21 wherein said opaque means is injection molded and said light carrier means is injection molded into said opaque means forming an integral assembly.

* * * * *